United States Patent [19]

Chen et al.

[11] Patent Number: 5,110,755
[45] Date of Patent: May 5, 1992

[54] PROCESS FOR FORMING A COMPONENT INSULATOR ON A SILICON SUBSTRATE

[75] Inventors: Li-Shu Chen, Ellicott City; Rathindra N. Ghoshtagore, Columbia; Alfred P. Turley, Ellicott City; Louis A. Yannone, Pasadena, all of Md.

[73] Assignee: Westinghouse Electric Corp., Pittsburgh, Pa.

[21] Appl. No.: 460,703

[22] Filed: Jan. 4, 1990

[51] Int. Cl.[5] .............................. H01L 21/76
[52] U.S. Cl. ..................... 437/62; 437/67; 437/71; 437/90
[58] Field of Search ............... 437/62, 71, 67, 90

[56] References Cited

U.S. PATENT DOCUMENTS

| | | | |
|---|---|---|---|
| 3,954,523 | 5/1976 | Magdo et al. | 357/40 |
| 4,016,017 | 4/1977 | Aboaf et al. | 148/187 |
| 4,104,090 | 8/1978 | Pogge | 148/175 |
| 4,346,513 | 8/1982 | Nishizawa et al. | 29/580 |
| 4,380,865 | 4/1983 | Frye et al. | 29/576 W |
| 4,505,766 | 3/1985 | Nagumo et al. | 148/175 |
| 4,532,700 | 8/1985 | Kinney et al. | 29/576 W |
| 4,604,162 | 8/1986 | Sobczak | 156/657 |
| 4,615,746 | 10/1986 | Kawakita et al. | 148/1.5 |
| 4,628,591 | 12/1986 | Zorinsky et al. | 29/576 W |
| 4,653,177 | 3/1987 | Lebowitz | 437/71 |
| 4,735,679 | 4/1988 | Lasky | 156/636 |
| 4,760,036 | 7/1988 | Schubert | 437/90 |
| 4,810,667 | 3/1989 | Zorinsky et al. | 437/62 |

FOREIGN PATENT DOCUMENTS 54-020677  2/1979  Japan .................... 437/71

Primary Examiner—Olik Chaudhuri
Assistant Examiner—G. Fourson
Attorney, Agent, or Firm—D. G. Maire

[57] ABSTRACT

A process for forming an insulating layer of silicon dioxide in a silicon substrate that surrounds and electrically insulates a semiconductor device is disclosed herein. The process comprises the steps of forming a recess on the outer surface of the silicon substrate that encompasses the site of the semiconductor device by photo-resist patterned reactive ion etching, and then removing silicon on the surface of the resulting recess whose crystal structure has been damaged by the reactive ion etching. Next, dopant atoms are selectively deposited on the surface of the recess so that the surface of the recess might be rendered into a porous layer of silicon when immersed in hydrogen fluoride and subjected to an electrical current. Prior to the porousification step, silicon is epitaxially grown within the walls of the recess to form the site for a semiconductor device. The substrate is then immersed in hydrogen fluoride while a current is conducted through it in order to porousify the silicon between the device island and the rest of the substrate. Finally, the substrate is thermally oxidized in order to render the porous layer of silicon into a insulating layer of silicon dioxide. The provision of such individual insulating layers around each of the devices on the substrate allows the manufacture of a high density and radiation hard semiconductor array that is not susceptible to electrical current leakage between components.

23 Claims, 2 Drawing Sheets

PROCESS FOR FORMING A COMPONENT INSULATOR ON A SILICON SUBSTRATE

BACKGROUND OF THE INVENTION

This invention is generally concerned with the formation of an insulating layer on the substrate of a silicon semiconductor wafer in order to electrically isolate the various semiconductor devices manufactured thereon, and is specifically concerned with a process which forms a tub-like insulating layer around an epitaxial island of silicon which may then be used to form a semiconductor device on the wafer.

Processes for forming insulating layers on semiconductor substrates for purposes of electrical isolation are known in the prior art. For example, in the SOS (silicon on sapphire) process, the entire silicon substrate is grown over a single crystal of insulating sapphire. While the sapphire layer has been shown to be effective in insulating individual transistors or other devices formed on the layer of silicon grown over the sapphire, there are unfortunately several shortcomings associated with the resulting device. For example, because the insulating layer of sapphire isolates not only the regions around each of the transistors, but also the regions beneath each of these transistors, it is difficult if not impossible to employ the well-known technique of back channel biasing in the resulting structure. Such biasing is useful in preventing back channel current leakage through the transistors that is caused by charge accumulation at the silicon-sapphire interface from radiation or other causes. Additionally, because the crystal structure of sapphire is different from silicon, lattice mismatch occurs in the interface between the sapphire and the silicon grown over it which in turn impairs the quality of the resulting epitaxially grown silicon. Other shortcomings include the high cost of providing the sapphire crystal, as well as the brittle nature of sapphire, which may cause it to crack when subjected to mechanical or thermal stresses.

In response to the shortcomings of the SOS process, the SIMOX (separation by implantation of oxygen) process was developed. In this process, high voltage high current ion implantation is used to implant oxygen ions at a selected depth within a silicon substrate. The resulting substrate is annealed to cause the oxygen atoms to react with silicon to create an internal, insulating layer of silicon dioxide. Because the insulating layer is thin relative to the insulating layer of sapphire used in the SOS process, back channel biasing may be used in connection with the transistors formed on the silicon film. However, other shortcomings are present. For example, the integrity of the crystalline structure of the silicon above the implant layer is marred by the passage of high energy oxygen ions through it. Such marring of the crystallinity of the silicon can jeopardize the performance of the transistors or other semiconductor devices that are ultimately fabricated upon this layer. Additionally, the necessity of using a high current ion implanter renders this process relatively expensive.

As an alternative to the SIMOX process, the FIPOS (full isolation by porous silicon) process may be used to form insulating layers around the semiconductor devices ultimately fabricated on the silicon substrate. In this process, impurity diffusion or ion implantation is used to form a doped layer in the silicon substrate. After this, a layer of undoped epitaxial silicon is grown over the doped layer of silicon. Next, trenches are etched into the outer layer of silicon to define islands of undoped silicon over the doped region of silicon where transistors or other semiconductor devices will be fabricated. The resulting substrate is then anodized by subjecting it to a positive potential while it is immersed in an aqueous solution of hydrogen fluoride. Because the doped region of the silicon substrate reacts with the ions in the hydrogen fluoride solution, the silicon in the doped layer becomes partially dissolved, such that a porous layer of silicon is created beneath every island of undoped silicon in the substrate. This porous layer is converted to silicon dioxide by way of thermal oxidation, and the silicon dioxide-lined trenches that are disposed between the silicon islands are then filled with a silicon oxide for planarization purposes. Unfortunately, this process produces a substrate which is apt to warp or curl as a result of thermal stresses. Additionally, the trench-filling step required for planarization is a slow and expensive step to implement.

Clearly, what is needed is a process that is capable of individually surrounding each semiconductor site with a layer of insulating material without marring the quality of the silicon used to fabricate the transistor or other semiconductor device. Ideally, such a process should be low cost and simple, and not require a trench filling step, and should produce a silicon substrate which is not apt to warp or curl when subjected to thermal oxidation or other heat treatment.

SUMMARY OF THE INVENTION

Generally speaking, the invention is a process for forming an insulating layer of material in a semiconductive substrate around the site of a semiconductive device that avoids the shortcomings of the prior art. The process comprises the steps of forming a recess on an outer surface of the substrate that encompasses the site, selectively depositing impurity ions on the surface of the recess to dope the same so that a porous layer of semiconductor material is created when the surface is exposed to a reactive chemical, filling the recess with the same type of semiconductive material that forms the substrate to form a device island, exposing the site to the reactive chemical so that a porous layer is formed in the doped layer that is disposed between the device island and the rest of the substrate, and oxidizing the porous layer into an insulating layer.

In the preferred embodiment, the semiconductive material forming the substrate is silicon, and the recess is formed by photo-resist patterned reactive ion etching. The walls of the resulting recess are further etched with a KOH silicon etch in order to remove damaged silicon therefrom. This way, a perfect crystal-to-crystal match is obtained when the recess is filled with epitaxially grown silicon by way of chemical vapor deposition.

The reactive chemical used to generate a porous layer of silicon between the silicon grown within the recess and the rest of the substrate is an aqueous solution of hydrogen fluoride. During this step of the process, the substrate is electrically connected to an anode when immersed within the aqueous solution of hydrogen fluoride. To facilitate conduction of the electric current throughout the substrate, dopant atoms may be deposited on the back side of the substrate as well as within the recess during the doping step so as to render the back side of the substrate electrically conductive.

In the preferred process of the invention, a layer of silicon dioxide is preferably grown over the outer surface of the substrate prior to the forming of a recess therein. Such an oxide layer is preferably obtained by thermal oxidation. The silicon dioxide advantageously provides an oxide mask that confines the deposition of impurity atoms to the walls and floor of the recess on the front side of the substrate, and further confines the growth of the epitaxially grown silicon to only those areas within the recesses. Alternatively, the oxide mask may be dispensed with and the epitaxially grown silicon may be allowed to grow on the outer surface of the substrate as well as within the recesses. However, in this embodiment of the process, a planarization step implemented by chemical and mechanical polishing would be necessary to render the upper surface of the silicon islands level with the upper surface of the silicon substrate.

The resulting substrate is capable of accommodating a large number of densely-packed transistors or other semiconductor devices which are fully dielectrically isolated. The resulting substrate is radiation hard, and back biasing voltages may be applied if desired. Finally, because the crystalline structure of the substrate is integral throughout much of its thickness (i.e., is not split throughout its entire thickness by a single insulating layer), the resulting substrate is not prone to warpage when exposed to thermal stresses.

BRIEF DESCRIPTION OF THE SEVERAL FIGURES

DETAILED DESCRIPTION OF THE PREFERRED EMBODIMENT

Figure 1A:
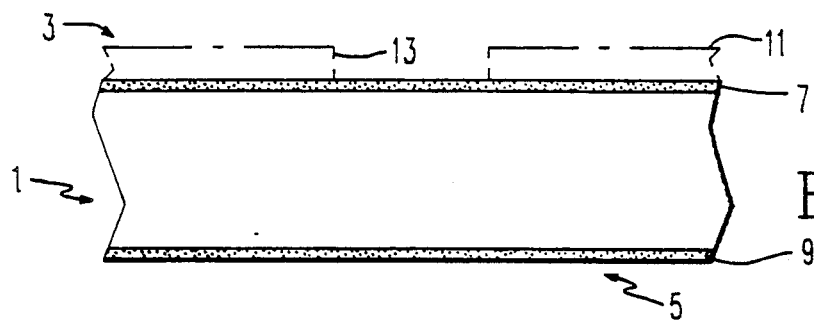
FIGS. 1A–1F illustrate a silicon substrate onto which the process of the invention has been applied to create an insulating layer of material between a silicon island which may be used to form a transistor or other semiconductor device.
Figure 1B:
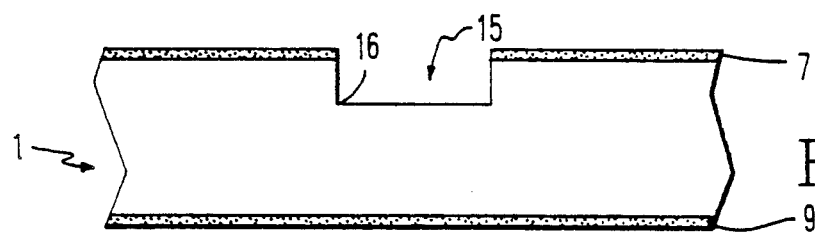

With reference now to FIGS. 1A and 1B, the instant invention is particularly adapted to produce an insulating layer of material around each one of a plurality of semiconductor components manufactured within a conventional silicon substrate or wafer 1 having an outer or front side 3, and an inner or back side 5. The substrate 1 may be a P-type, boron doped silicon wafer with <1, 0, 0> orientation and a resistivity of 20 ohm-cm.

In the first step of the process, a layer of silicon dioxide 7,9 is grown on the front and back sides 3,5 of the silicon substrate 1 by thermal oxidation. In the preferred embodiment, each of the silicon dioxide layers 7 and 9 are grown at a temperature of 1100° C. until they attain a thickness of 3,000 angstroms. The advantage associated with the production of such a silicon dioxide layer 7 on the front side 3 of the substrate 1 will become apparent shortly.

A photo-resist 11 having openings 13 is next applied over the outer side 3 of the substrate 1 in a conventional manner. This may be achieved by coating the substrate 1 with photo-resist material at 4 Krpm. The photo-resist 11 is exposed through a mask to the ultraviolet light emitted by an alignment tool. The mask pattern is designed to expose the areas of the photo-resist 11 which are to define the recesses 15 that are ultimately created in the substrate 1.

After the photo-resist 11 is developed to create a plurality of openings 13 therein, the silicon substrate 1 is then subjected to a reactive ion etch (RIE) to create a recess or well 15. The substrate 1 may be etched with an "Anelva Model No. 506" RIE etcher, wherein the etching off of the silicon dioxide layer 7 under the opening 13 is done at 300 watts, 35 mtorr, at 325 volts with 20 SCCM of $C_2F_6$ and 125 SCCM of $CHF_3$. At the time this is done, the silicon dioxide layer 9 on the back side 5 should also be etched off to leave the back side 5 free to be diffusion doped. After the etching off of the silicon dioxide layer 7 the etching of the silicon to create the recess or well 15 was performed at 300 watts, 65 mtorr, with 15 SCCM of chlorine and 85 SCCM of helium. It should be noted that during the well forming step, the silicon dioxide layer 7 advantageously serves as a mask that confines the silicon etch to the desired well region.

Figure 1C:
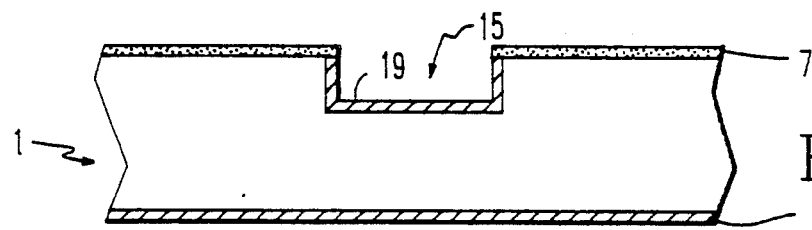
Figure 1D:
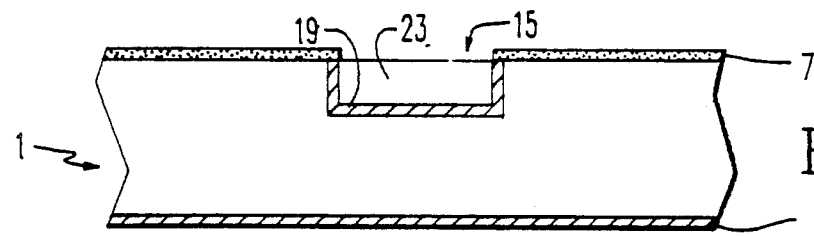

With reference now to FIGS. 1C and 1D, the outer side 3 of the substrate 1 is again coated with a photoresist. The layers 9 of silicon dioxide on the inner side 5 of the substrate 1 is then stripped off with a buffered solution of hydrogen fluoride. The photoresist that was applied over the outer side 3 of the substrate 1 is then stripped off of the substrate 1. The substrate 1 is next cleaned with a standard acid wafer clean, which is a mixture of sulfuric acid and hydrogen peroxide. This step is then followed by a 500 angstrom silicon dioxide etch with buffered hydrogen fluoride. The purpose of this last step is to insure that no silicon dioxide is left on the walls of the recess or well 15. Next, the silicon substrate 1 is further treated with a 40 C KOH solution which removes 500 angstroms of silicon from the surface of the recess or well 15. This last step is important, as it removes any silicon from the surface of the recess 15 whose atomic crystalline structure has been damaged by the RIE and which could interfere with the growth of a perfectly matched epitaxial silicon within the recess 15. All in all, approximately 500 angstroms of silicon is removed from inside the recess 15 for this purpose.

After a standard substrate cleaning, the surface 16 of the recess 15 is diffusion doped for example to a density of between $10^{18}$ and $10^{20}$ atoms/cm$^3$, which will be specified as a density of $10^{19}$ atoms/cm$^3$ in this example. For these purposes, boron atoms are deposited onto the surface 16 for fifteen minutes at a temperature of 1060° centigrade. Preferably the back side 5 of the substrate 1 is likewise diffusion doped to the same concentration for a purpose which will be explained shortly. The substrate 1 is deglazed after being diffusion doped with boron atoms. The applicants have found that when the boron diffusion doping is carried out at the aforementioned parameters, a doped layer 19 and 21 of material is formed over the surface 16 of the recess 15 and on the back side 5 of the substrate 1 that has an impurity density of between 3 and $5 \times 10^{19}$ atoms/cm$^3$ on a diffusion front which advantageously very near to that of a step function.

With specific reference now to FIG. 1D, the substrate 1 is next subjected to selective intrinsic epitaxial silicon growth. The epitaxial growth conditions were chosen as:
  (1) dichlorosilane—200 SCCM;
  (2) hydrogen chloride gas—600 SCCM;
  (3) deposition temperature—875° C.;
  (4) total pressure—31 torr;
  (5) deposition time—50 minutes;
  (6) growth rate—0.018 um/min.

The removal of all damaged silicon from the surface 16 of the recess 15 allows an essentially perfect crystal-to-crystal match between the epitaxially grown silicon 23 within the recess 15 and the balance of the silicon substrate 1. Moreover, the provision of the silicon dioxide layer 7 over all portions of the outer side 3 of the substrate 1 except for the recesses 15 advantageously prevents the silicon 23 from growing over the outer side 3. While the silicon dioxide layer 7 could be dispensed with and silicon epitaxially grown both within the recess 15 and on the outer side of the substrate 1, such an alternative method would disadvantageously require the outer surface 3 of the substrate 1 to be planarized with RIE or a mechanical and chemical polishing to bring the outer side of the epitaxially grown silicon 23 within the recess 15 coplanar with the outer side 3 of the substrate 1.

Figure 1E:
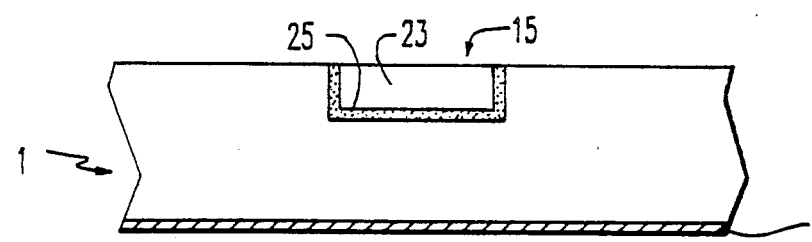
Figure 1F:
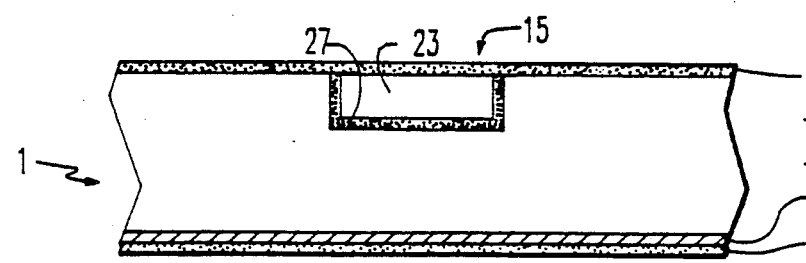
Figure 2:
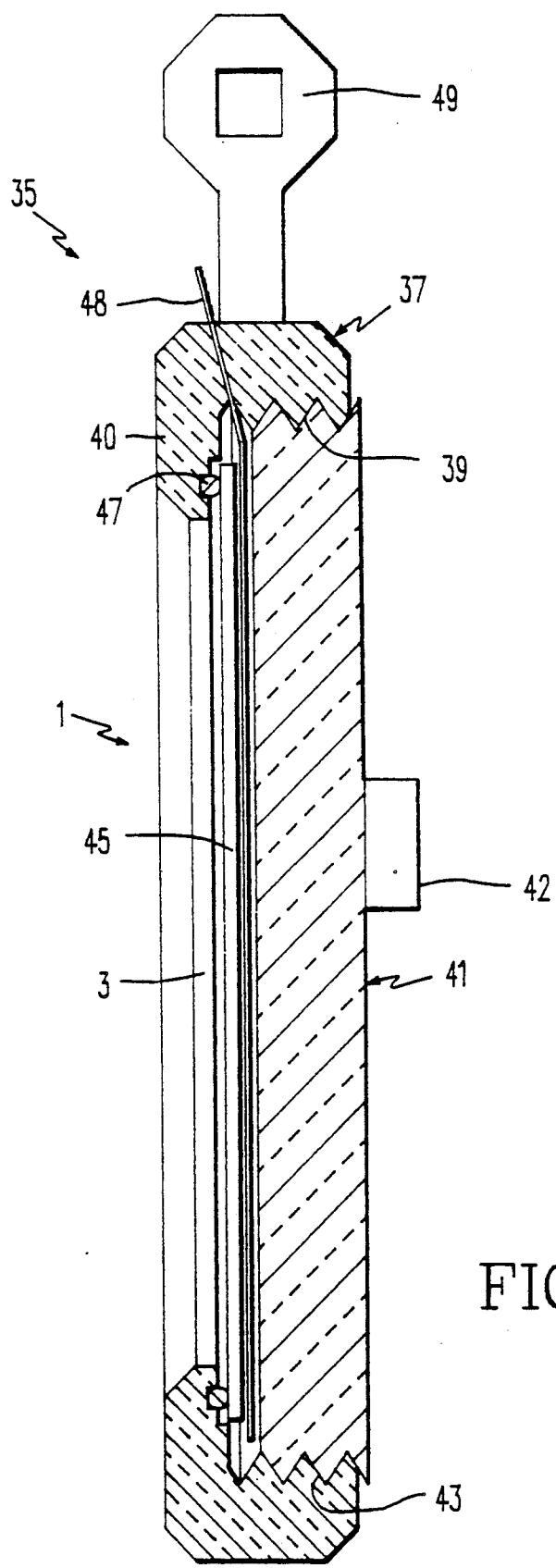
FIG. 2 is a cross-sectional side view of an electrode (anode) used in the anodization step of the process.

With reference now to FIGS. 1E and 2, a porous silicon layer 25 is formed between the epitaxially grown silicon 23 and the rest of the substrate 1 by means of an anodization with an anode structure 35. This anode 35 includes a circular frame 37 of Teflon ® having inner screw threads 39 on one side, and an annular shoulder 40 on the other side. The anode 35 further includes a disk shaped body 41 having an integrally formed nut 42 in its center and screw threads 43 on its outer diameter as shown which are engageable with the inner screw threads 39 of the frame 37. In operation, a circular shaped silicon wafer which includes the substrate 1 is sandwiched between a platinum electrode 45 on one side and an O-ring 47 on its other side which is retained by the annular shoulder 40. The disk shaped body 41 is screwed into the frame 37 until a fluid-tight seal is created between the O-ring 47 and the periphery of the silicon substrate 1. The entire anode 35 is then immersed in an aqueous solution of hydrogen fluoride, and a positive voltage is applied to a wire 48 connected to the platinum electrode 45. A handle 49 is provided on the cell 35 to facilitate the immersion operation. In the preferred embodiment, the hydrogen fluoride bath is preferably a mixture of five parts of 49% HF and two parts of methanol. Current density for the anodization step is preferably 35 milliamps/sq. centimeter. The current is continuously applied until the doped layer 19 which lines the surface 16 of the recess 15 is rendered into a porous silicon layer 25. At this juncture, it should be noted that the doped layer 21 on the inner side 5 of the silicon substrate greatly facilitates the anodization and porousification operation by providing a large conductive surface for the platinum plate electrode 45 to engage.

After the creation of the porous layer 25, the silicon wafer upon which the substrate 1 is included is dried completely in a vacuum. In the final steps of the process, the porous silicon layer 25 is rendered into a insulating layer 27 of silicon dioxide by thermal oxidation wherein the substrate 1 is subjected to a temperature of 300° C. for one hour with dry oxygen, 1000° C. for twenty minutes with pyrogenic oxidation, and 1100° C. for ten minutes with dry oxygen followed by one hour of annealing with nitrogen. Such a thermal oxidation procedure provides porous silicon strengthening, oxidation of the porous silicon, and densification of the porous oxide. While this thermal oxidation also creates layers of silicon dioxide 29, 31 on the front and back sides 3,5 of the substrate 1, these layers are relatively thin due to the relatively larger surface area of the porous silicon layer 25.

The process of the invention provides an island 23 of epitaxially grown silicon which is insulated by a thin layer 27 of silicon dioxide 2 from the balance of the substrate 1. The thickness of the resulting silicon island 23 is approximately 0.89 um or thinner, and the front side 3 of the substrate after the anodization operation is reasonably flat so that planarization is not necessary. The resulting islands 23 of silicon may be used to form transistors or other semiconductor devices, and the insulating layer 27 which surrounds each of these islands 23 allows the manufacture of a very dense array of such semiconductor devices on a single substrate which are electrically isolated and which are radiation hard.

We claim:

1. A process for forming an insulating layer of material in a semiconductive substrate around the site of a semiconductor device in the substrate, wherein said substrate is formed from an oxidizable semiconductor material, comprising the sequence of steps of:

forming a recess on a top surface of said substrate that encompasses said site;

depositing dopant atoms on the surface of the recess while heating said substrate to form a doped layer on said recess surface;

filling said recess with the same type of semiconductive material that forms said substrate to form a device island;

anodizing said site so that said doped layer is formed into a porous layer, and oxidizing said porous layer into an insulating layer.

2. A process for forming an insulating layer as defined in claim 1, wherein said semiconductive material is silicon.

3. A process for forming an insulating layer as defined in claim 1, wherein said surface of said recess is doped at a doping level of between $10^{18}$ and $10^{20}$ atoms/cm$^3$.

4. A process for forming an insulating layer as defined in claim 1, wherein the recess is filled by depositing a layer of said semiconductor material over said recess by epitaxial growth.

5. A process for forming an insulating layer as defined in claim 4, further including the step of planarizing the substrate after said layer of semiconductor material is epitaxially grown over said substrate so that the surface of said device island is coplanar with said top surface of the substrate.

6. A process for forming an insulating layer as defined in claim 4, wherein said deposition of semiconductor material is confined to said recess by selectively epitaxially growing said material only in said recess.

7. A process for forming an insulating layer as defined in claim 2, wherein said porous layer is formed by anodizing said substrate in an aqueous solution of hydrogen fluoride.

8. A process for forming an insulating layer as defined in claim 1, wherein said recess is formed by oxidizing said top surface, applying a photo-resist pattern over the area surrounding the site to define said recess, and then subjecting said area to a reactive ion etch to form said recess.

9. A process for forming an insulating layer as defined in claim 8, further including the step of subjecting said surface of the recess to a chemical etch in order to remove semiconductor material whose crystal structure has been damaged by the reactive ion etch.

10. A process for forming an isolating layer of material in a silicon substrate around the site of a semiconductor device in the substrate, comprising the sequence of steps of:

forming a recess on a top surface of said substrate that encompasses said site;

depositing dopant atoms on the surface of the recess while heating said substrate to form a doped layer on said recess surface;

filling said recess with epitaxially grown silicon to form a device island in the substrate;

anodizing said site so that said doped layer is formed into a porous layer, and thermally oxidizing said porous layer into an insulating layer of silicon dioxide.

11. A process for forming an insulating layer of material as defined in claim 10, further including the step of providing a silicon dioxide mask on the portion of the substrate surrounding said recess so that said epitaxially grown silicon grows only within said recess.

12. A process for forming an insulating layer of material as defined in claim 10, further including the step of planarizing the surface of the substrate where said silicon layer is epitaxially grown so that the surface of said device island is rendered coplanar with said top surface of the substrate.

13. A process for forming an insulating layer of material as defined in claim 12, wherein said planarization is achieved through chemical and mechanical polishing.

14. A process for forming an insulating layer of material as defined in claim 10, wherein said recess surface is doped at a doping level of between $10^{18}$ and $10^{20}$ atoms/cm$^3$.

15. A process for forming an insulating layer of material as defined in claim 10, wherein said recess is formed by oxidizing said top surface of said substrate, applying a photo-resist pattern over the area surrounding the site to defined said recess, and then subjecting said area to a reactive ion etch to form said recess 16. A process for forming an insulating layer of material as defined in claim 15, further including the step of subjecting said recess surface to a chemical etch in order to remove semiconductor material whose atomic structure has been damaged by the reactive ion etch.

17. A process for forming an insulating layer of material as defined in claim 10, wherein said porous layer is formed by anodizing said substrate in an aqueous solution of hydrogen fluoride.

18. A process for forming an insulating layer of material as defined in claim 17, wherein dopant atoms are deposited on a bottom surface of the substrate at the same time they are deposited on said recess surface to form a contact region for the application of the positive charge used in the anodization step.

19. A process for forming an insulating layer of silicon dioxide in a silicon substrate that surrounds and electrically insulates the site of a semiconductor device, comprising the sequence of steps of:

providing a layer of silicon dioxide on a top surface of the substrate;

forming a recess on said top surface of said substrate that encompasses said site by photo-resist patterned reactive ion etching so that said layer of silicon dioxide remains intact over said top surface except over said recess;

removing silicon on the surface of said recess whose crystal structure has been damaged by said reactive ion etching;

depositing dopant atoms on said recess surface while heating said substrate to form a doped layer on said recess surface;

epitaxially growing a layer of silicon within said recess to create an island of silicon there in until the top surface of said island is substantially coplanar with said top surface of said substrate, wherein said layer of silicon dioxide prevents silicon from growing anywhere on the surface of the substrate except within said recess;

anodizing said site to render said doped layer into a layer of porous silicon between said island and said substrate, and thermally oxidizing said substrate to convert said porous layer of silicon into an insulating layer of silicon dioxide.

20. A process for forming an insulating layer of silicon dioxide as defined in claim 19, wherein said damaged silicon is removed by a KOH silicon etch.

21. A process for forming an insulating layer of silicon dioxide as defined in claim 19, wherein said dopant atoms are deposed by diffusion doping at 1060° C. for 15 minutes using boron nitride.

22. A process for forming an insulating layer of silicon dioxide as defined in claim 19, wherein dopant atoms are deposited on a bottom surface of the substrate when they are deposited on said recess surface to form a contact region for the application of a positive charge used in the anodization step.

23. A process for forming an insulating layer of silicon dioxide as defined in claim 19, wherein said recess surface is doped to a level of between $10^{18}$ and $10^{20}$ atoms/cm$^3$.

* * * * *